(12) United States Patent
Sasaki et al.

(10) Patent No.: US 8,465,998 B2
(45) Date of Patent: Jun. 18, 2013

(54) THERMOELECTRIC CONVERSION MODULE AND METHOD FOR MANUFACTURING THERMOELECTRIC CONVERSION MODULE

(75) Inventors: Masahiro Sasaki, Yasu (JP); Takanori Nakamura, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 216 days.

(21) Appl. No.: 12/963,710

(22) Filed: Dec. 9, 2010

(65) Prior Publication Data

US 2011/0081741 A1   Apr. 7, 2011

Related U.S. Application Data

(60) Division of application No. 12/687,908, filed on Jan. 15, 2010, now abandoned, which is a continuation of application No. PCT/JP2008/063060, filed on Jul. 18, 2008.

(30) Foreign Application Priority Data

Jul. 19, 2007   (JP) ................................. 2007-188029

(51) Int. Cl.
*H01L 21/00* (2006.01)
(52) U.S. Cl.
USPC ........ 438/54; 438/55; 257/467; 257/E27.008; 136/201; 136/212
(58) Field of Classification Search
USPC ............... 438/54, 55; 136/201, 212; 257/467, 257/E27.008
See application file for complete search history.

(56) References Cited

U.S. PATENT DOCUMENTS

| | | | |
|---|---|---|---|
| 5,897,330 A * | 4/1999 | Watanabe et al. | 438/55 |
| 6,127,619 A * | 10/2000 | Xi et al. | 136/203 |
| 2006/0243315 A1 * | 11/2006 | Chrysler et al. | 136/201 |

OTHER PUBLICATIONS

Sasaki et al.; "Thermoelectric Conversion Module and Method for Manufacturing Thermoelectric Conversion Module"; U.S. Appl. No. 12/687,908, filed Jan. 15, 2010.

* cited by examiner

*Primary Examiner* — Kimberly Rizkallah
*Assistant Examiner* — Maria Ligai
(74) *Attorney, Agent, or Firm* — Keating & Bennett, LLP

(57) ABSTRACT

A thermoelectric conversion module includes a laminated body including a plurality of thermoelectric components laminated therein. Each of the thermoelectric components includes an insulating layer, and a thermoelectric conversion element section in which a plurality of p-type thermoelectric conversion material layers and a plurality of n-type thermoelectric conversion material layers are arranged on the insulating layer in a series connection. A step eliminating insulating material layer is arranged to eliminate a step between the thermoelectric conversion element section and a vicinity thereof, in a region between the insulating layers adjacent to each other in a laminating direction, around the p-type thermoelectric conversion material layers and n-type thermoelectric conversion material layers constituting the thermoelectric conversion element section. The thermoelectric conversion element section has a serpentine shape. Thicknesses of the p-type and n-type thermoelectric conversion material layers constituting the thermoelectric conversion element section are greater than the thickness of the insulating layer.

3 Claims, 7 Drawing Sheets

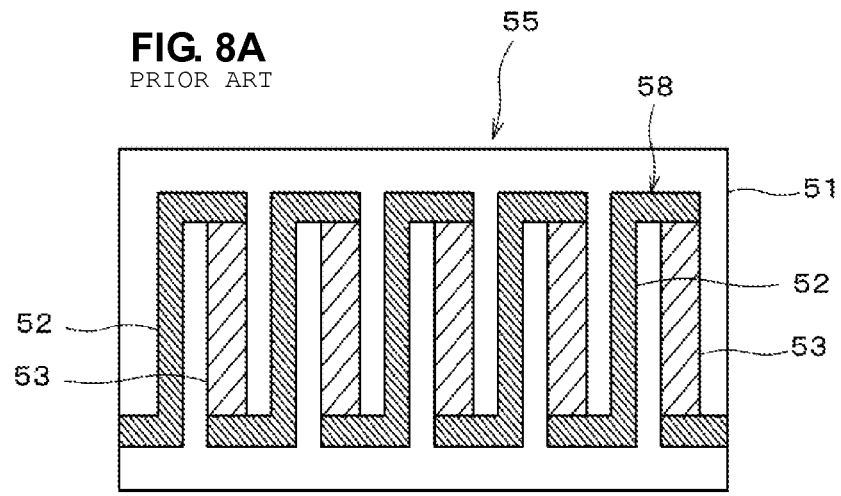
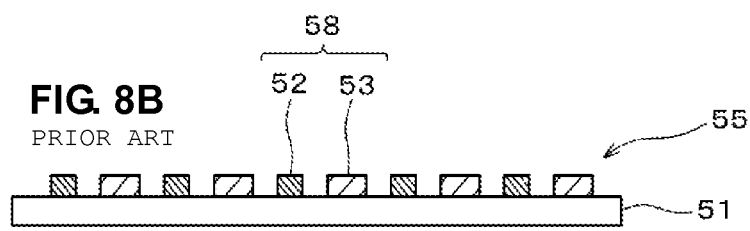
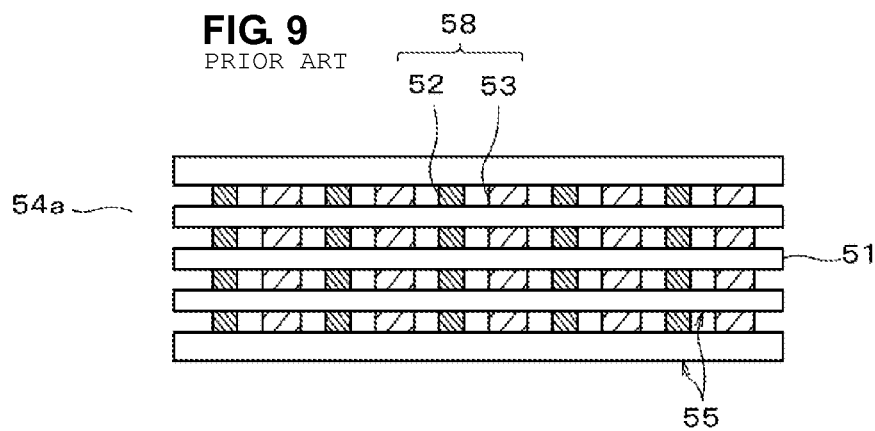

THERMOELECTRIC CONVERSION MODULE AND METHOD FOR MANUFACTURING THERMOELECTRIC CONVERSION MODULE

BACKGROUND OF THE INVENTION

1. Field of the Invention

The present invention relates to a thermoelectric conversion module and a method for manufacturing the thermoelectric conversion module.

2. Description of the Related Art

In recent years, thermoelectric conversion techniques for converting heat to electricity have been advanced. Particularly, in recent years, for the purpose of preventing global warming, the reduction in carbon dioxide has become a critical issue, and thermoelectric conversion modules that are able to convert heat directly to electricity have been attracting attention as one of the effective waste heat recovery techniques.

One of such thermoelectric conversion modules is configured to have multiple thermoelectric conversion element sections laminated with an insulating layer interposed therebetween, in which a plurality of n-type thermoelectric conversion material layers and a plurality of p-type thermoelectric conversion material layers are provided in a serpentine shape (zigzag shape) so that multiple p-n junctions are arranged in series, achieving that the sum of thermal electromotive forces generated in the respective p-n junctions can be extracted (see FIGS. 1 and 2 of Japanese Unexamined Patent Publication No. 11-177154)

Such a thermoelectric module is manufactured by, for example, a method as described below.

First, as shown in FIGS. 8A and 8B, a thermoelectric component sheet 55 is prepared and includes p-type thermoelectric conversion material layers (patterns) 52 and n-type thermoelectric conversion material layers (patterns) 53 formed by printing each of a Ni paste for the formation of n-type thermoelectric conversion material layers and a Cu paste for the formation of p-type thermoelectric conversion material layers to have a predetermined width (for example, 150 μm) and a printed width (for example, 20 μm) on the principal surface of a insulator green sheet 51 with a predetermined thickness (for example, 50 μm).

Then, the thermoelectric component sheet 55 is laminated as shown in FIG. 9, followed by pressure bonding, and an uncalcined laminated body 54a obtained is calcined.

This method provides a calcined laminated body 54 (FIG. 10) which has a structure obtained by laminating the multiple thermoelectric components 55 each provided with a thermoelectric conversion element section 58 composed of p-type thermoelectric conversion material layers 52 and n-type thermoelectric conversion material layers 53 connected in series with the insulating layer 51 interposed therebetween.

Then, as shown in FIG. 10, external electrodes 57a, 57b are formed on the calcined laminated body 54 so as to provide conduction to the thermoelectric conversion element sections 58 (FIGS. 8A and 8B).

The thus obtained thermoelectric conversion module 60 (FIG. 10) is provided and used in a mode, for example, with an edge surface 56a side as a higher temperature side and an edge surface 56b side as a lower temperature side, perpendicular to the principal surface of the insulating layer obtained by the calcination of the insulator green sheet 51 described above.

Meanwhile, in the thermoelectric conversion module 60 configured as described above, it is necessary to increase the occupancy of the thermoelectric conversion materials in the thermoelectric conversion module (the ratio of the area occupied by the thermoelectric conversion materials in a plane perpendicular to the direction of a temperature difference caused in the thermoelectric conversion module) in order to increase the output per unit area of the module (plane area of the product). For that purpose, it is necessary to increase the thicknesses of the p-type and n-type thermoelectric conversion materials in relation to the thickness of the insulating layer.

However, as in Japanese Unexamined Patent Publication No. 11-177154 described above, in the case of the method of laminating, on an insulator green sheet, sheets with p-type thermoelectric conversion material patterns and n-type thermoelectric conversion material patterns formed, increase in thickness the p-type thermoelectric conversion material patterns and n-type thermoelectric conversion material patterns is likely to cause deviation of the lamination and deformation in the step of laminating or pressure bonding. In particular, when the p-type thermoelectric conversion material patterns and n-type thermoelectric conversion material patterns are increased in thickness more than the insulator green sheet, deviation of the lamination and deformation are easily caused, and in fact, it is the case that it is not possible to increase the thicknesses of the thermoelectric conversion material layers more than the thickness of the insulating layer.

SUMMARY OF THE INVENTION

In order to solve the problems described above, preferred embodiments of the present invention provide a smaller thermoelectric conversion module which provides higher outputs and electromotive forces without causing deviation of lamination or deformation even when p-type thermoelectric conversion material layers and n-type thermoelectric conversion material layers are increased in thickness in order to increase the occupancy of the thermoelectric conversion materials, as well as a method for manufacturing the thermoelectric conversion module.

According to a preferred embodiment of the present invention, a thermoelectric conversion module includes a laminated body including a plurality of thermoelectric components laminated therein, wherein the thermoelectric components each include an insulating layer and a thermoelectric conversion element section in which a p-type thermoelectric conversion material layer and an n-type thermoelectric conversion material layer are arranged in a series connection on the insulating layer, and a step eliminating insulating material layer is arranged to eliminate a step between the thermoelectric conversion element section and a vicinity thereof, in a region sandwiched between the insulating layers adjacent to each other in a laminating direction, around the p-type thermoelectric conversion material layers and the n-type thermoelectric conversion material layers constituting the thermoelectric conversion element section.

In the thermoelectric conversion module according to a preferred embodiment of the present invention, preferably, the plurality of p-type thermoelectric conversion material layers and the plurality of n-type thermoelectric conversion material layers are alternately arranged in an electrically series connection to constitute a serpentine-shaped thermoelectric conversion element section.

Further, in the thermoelectric conversion module according to a preferred embodiment of the present invention, preferably, thicknesses of the p-type thermoelectric conversion material layers and the n-type thermoelectric conversion material layers constituting the thermoelectric conversion element section preferably are greater than a thickness of the insulating layer.

The step eliminating insulating material layer preferably includes a material which has a same composition as or a similar composition to that of an insulating material constituting the insulating layer.

In a method for manufacturing a thermoelectric conversion module according to another preferred embodiment of the present invention, the method includes the steps of arranging p-type thermoelectric conversion material patterns and n-type thermoelectric conversion material patterns in a series connection on a principal surface of a insulator green sheet to form a thermoelectric conversion element section pattern to serve as a thermoelectric conversion element section after calcination, providing a step eliminating insulating material on a region of the principal surface of the insulator green sheet in which none of the p-type thermoelectric conversion material and n-type thermoelectric conversion material is formed, in such a way that steps between surfaces of the p-type thermoelectric conversion material patterns and the n-type thermoelectric conversion material patterns and the principal surface of the insulator green sheet are substantially eliminated, thereby forming thermoelectric component sheets, laminating and pressure-bonding the thermoelectric component sheets to form a laminated body, and calcining the laminated body.

In the method for manufacturing a thermoelectric conversion module according to a preferred embodiment of the present invention, preferably, the plurality of p-type thermoelectric conversion material patterns and the plurality of n-type thermoelectric conversion material layers preferably are alternately arranged in an electrically series connection to form a serpentine-shaped thermoelectric conversion element section pattern.

Further, in the method for manufacturing a thermoelectric conversion module according to a preferred embodiment of the present invention, preferably, thicknesses of the p-type thermoelectric conversion material patterns and the n-type thermoelectric conversion material patterns are preferably greater than a thickness of the insulator green sheet.

As the step eliminating insulating material layer, preferably, a material is used which has a same composition as or a similar composition to that of an insulating material constituting the insulator green sheet.

In the thermoelectric conversion module according to a preferred embodiment of the present invention, a step eliminating insulating material layer is provided to eliminate a step between the thermoelectric conversion element section and a vicinity thereof, in a region sandwiched between the insulating layers adjacent to each other in the laminating direction, around the p-type thermoelectric conversion material layers and the n-type thermoelectric conversion material layers constituting the thermoelectric conversion element section. Therefore, the thicknesses of the p-type thermoelectric conversion material layers and the n-type thermoelectric conversion material layers can be made greater with no deviation of the lamination or deformation, thereby allowing the occupancy of the thermoelectric conversion materials to be improved and thus realizing a smaller thermoelectric conversion module which provides higher outputs and electromotive forces.

When the plurality of p-type thermoelectric conversion material layers and the plurality of n-type thermoelectric conversion material layers are alternately arranged in an electrically series connection to constitute the serpentine-shaped thermoelectric conversion element section, the density (wiring density) of providing the thermoelectric conversion element section on the insulating layer is improved to allow the occupancy of the thermoelectric conversion materials to be increased, and further to realize a thermoelectric conversion module which provides much higher outputs.

Furthermore, in a preferred embodiment of the present invention, even when the p-type thermoelectric conversion material layers and the n-type thermoelectric conversion material layers are increased in thickness, no deviation of the lamination or deformation will be caused. Therefore, it is possible to increase the thicknesses of the p-type thermoelectric conversion material layers and n-type thermoelectric conversion material layers constituting the thermoelectric conversion element section more than the thickness of the insulating layer, and in that case, it will be possible to obtain a much smaller and higher-performance thermoelectric conversion module.

Furthermore, when a layer composed of a material which has the same composition as or a similar composition to that of the insulating material constituting the insulating layer is used as the step eliminating insulating material layer, the types of raw materials are reduced in number to allow the manufacturing process to be simplified, and defects such as delamination due to differences in expansion and contraction behavior in the calcination step are prevented from being caused to allow a highly reliable thermoelectric conversion module to be manufactured efficiently.

Furthermore, according to the method for manufacturing a thermoelectric conversion module according to a preferred embodiment of the present invention, a step eliminating insulating material is provided on a region of the principal surface of the insulator green sheet in which none of the p-type thermoelectric conversion materials and the n-type thermoelectric conversion materials is formed, thereby forming a thermoelectric component sheet which is nearly uniform in thickness without steps, and such sheets are laminated to form a laminated body. Therefore, even when the p-type thermoelectric conversion material layers and the n-type thermoelectric conversion material layers are increased in thickness, no deviation of the lamination or deformation will be caused, thereby allowing the thermoelectric conversion module according to a preferred embodiment of the present invention to be manufactured efficiently and reliably.

Furthermore, when the plurality of p-type thermoelectric conversion material layers and the plurality of n-type thermoelectric conversion material layers are alternately arranged in an electrically series connection to constitute the serpentine-shaped thermoelectric conversion element section, the density (wiring density) of the thermoelectric conversion element section on the insulating layer is improved to allow the occupancy of the thermoelectric conversion materials to be increased, and further to realize a thermoelectric conversion module which provides much higher outputs.

Furthermore, when the p-type thermoelectric conversion material patterns and the n-type thermoelectric conversion material patterns provided on the principal surface of the insulating sheet are increased in thickness more than the thickness of the insulator green sheet, it will be possible to manufacture a higher-performance and smaller thermoelectric conversion module in which the p-type thermoelectric conversion material layers and the n-type thermoelectric conversion material layers constituting the thermoelectric element section have greater thicknesses than the thickness of the insulating layer.

Furthermore, when a material which has the same composition as or a similar composition to that of the insulating material constituting the insulator green sheet is used as the step eliminating insulating material, the types of raw materials are reduced in number to allow the manufacturing process to be simplified, and defects such as delamination due to differences in expansion and contraction behavior in the calcination step are prevented to allow a high reliable thermoelectric conversion module to be manufactured efficiently.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 8A and 8B are a plan view and a cross-sectional view each schematically illustrating a thermoelectric component constituting a conventional thermoelectric conversion module.

FIG. 9 is a diagram illustrating a state of a laminated body formed by laminating the thermoelectric components shown in FIGS. 8A and 8B, in a step of manufacturing the conventional thermoelectric conversion module.

DETAILED DESCRIPTION OF THE PREFERRED EMBODIMENTS

The features of the present invention will be described below in more detail in connection with preferred embodiments of the present invention.

Figure 1:
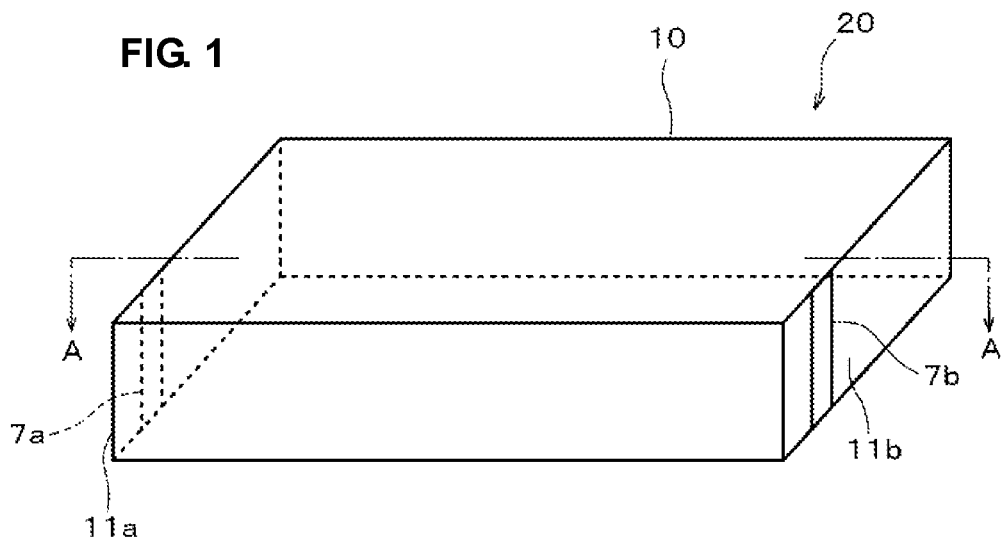
FIG. 1 is a perspective view illustrating a thermoelectric conversion module according to an example of a preferred embodiment of the present invention.
Figure 2:
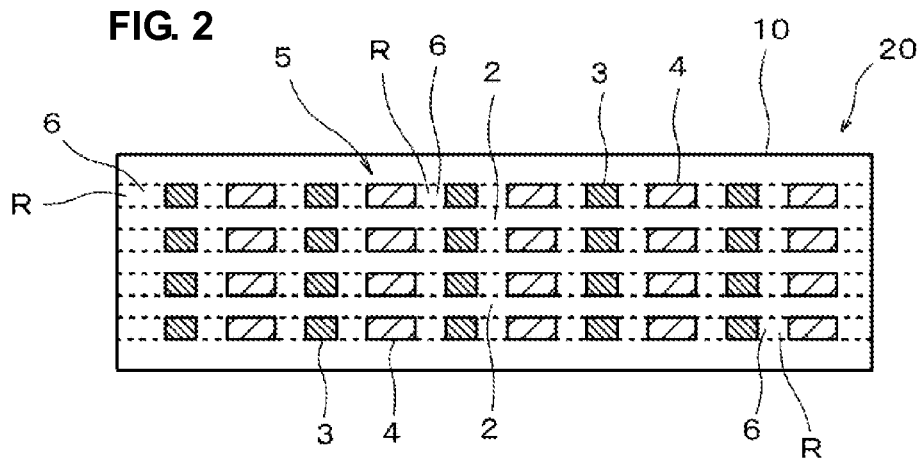
FIG. 2 is a cross-sectional view of the thermoelectric conversion module in FIG. 1 along the line A-A.
Figure 3:
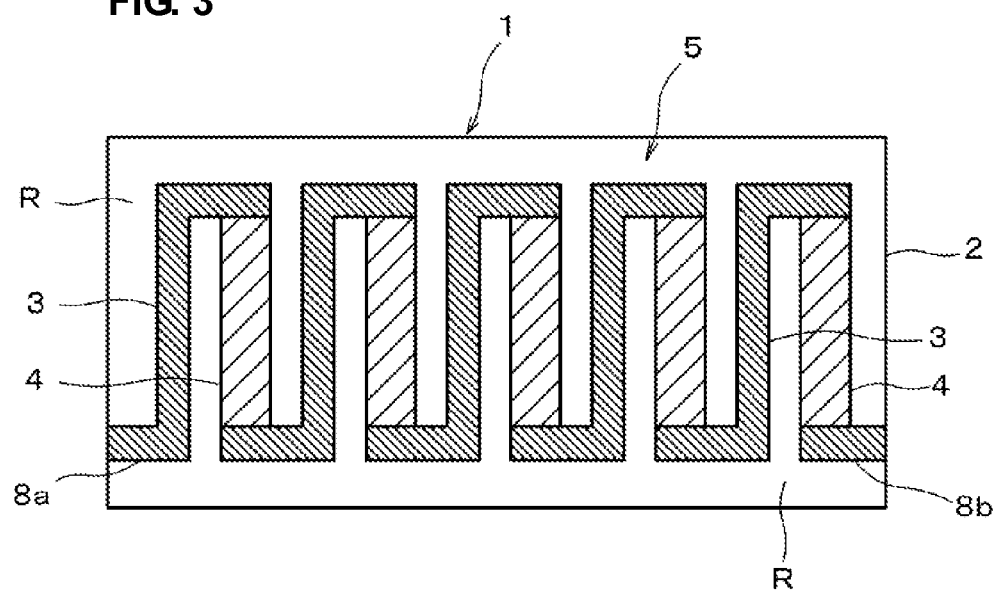
FIG. 3 is a diagram illustrating a thermoelectric component constituting a thermoelectric conversion module according to an example of a preferred embodiment of the present invention.

FIG. 1 is a perspective view illustrating a thermoelectric conversion module according to an example of a preferred embodiment of the present invention, FIG. 2 is a cross-sectional view of FIG. 1 along the line A-A, and FIG. 3 is a diagram illustrating a thermoelectric component constituting the thermoelectric conversion module.

As shown in FIGS. 1 to 3, such a thermoelectric conversion module 20 has a structure in which a laminated body 10 formed by laminating multiple thermoelectric components 1 (FIG. 3) is provided on end surfaces 11a, 11b thereof opposed to each other with a pair of external electrodes 7a, 7b.

The thermoelectric components 1 each include an insulating layer 2, a plurality of p-type thermoelectric conversion material layers 3 and a plurality of n-type thermoelectric conversion material layers 4 formed on the surface of the insulating layer 2, as shown in FIG. 3, and the plurality of p-type thermoelectric conversion material layers 3 and the plurality of n-type thermoelectric conversion material layers 4 are alternately connected electrically in series to constitute a serpentine-shaped thermoelectric conversion element section 5.

Further, in this thermoelectric conversion module 20, a step eliminating insulating material layer 6 (FIG. 2) is arranged to eliminate steps between the thermoelectric conversion element section 5 and its vicinity, in a region R (FIGS. 2, 3) sandwiched between the insulating layers 2 adjacent to each other in the laminating direction, around the p-type thermoelectric conversion material layers 3 and the n-type thermoelectric conversion material layers 4 constituting the thermoelectric conversion element section 5.

Furthermore, the thermoelectric component 1 constituting the thermoelectric conversion module 20 includes a first drawing section 8a and a second drawing section 8b respectively for electrically connecting one end of the serpentine-shaped thermoelectric conversion element section 5 to the end of the insulating layer 2 and for connecting the other end of the thermoelectric conversion element section 5 to the other end of the insulating layer 2.

In addition, the external electrodes 7a, 7b described above are electrically connected individually to the first drawing section 8a and the second drawing section 8b.

Manufacturing Method

Next, a method for manufacturing the thermoelectric conversion module according to an example a preferred embodiment of the present invention will be described.

Manufacture of Insulator Green Sheet (1) An insulator raw material composed of $BaCO_3$, $Al_2O_3$, and $SiO_2$ weighed to have predetermined compounding ratios was wet ground in a ball mill for approximately 20 hours with zirconia balls as media.

(2) After this mixture was calcined at about 850° C. to about 950° C. and subjected to wet grinding, an organic binder was added, followed by kneading to form into a sheet by a doctor blade method, thereby obtaining an insulator green sheet of about 25 μm in thickness.

Preparation of Insulating Material (Insulator Paste) for Step Elimination (1) In the same way as in the case of manufacturing the insulator green sheet described above, an insulator raw material composed of $BaCO_3$, $Al_2O_3$, and $SiO_2$ weighed to have predetermined compounding ratios was wet ground in a ball mill for approximately 20 hours with zirconia balls as media.

(2) Then, this mixture was calcined at about 850° C. to about 950° C. and subjected to wet grinding to give slurry.

(3) The obtained slurry was dried by a drier, followed by adding varnish and a solvent and kneading in a three roll mill, thereby manufacturing an insulator paste.

The insulating material constituting this insulator paste has the same composition as that of the insulating material constituting the insulator green sheet described above.

Manufacture of P-Type and N-Type Thermoelectric Conversion Materials (Thermoelectric Conversion Material Pastes)

Copper metal powder as a p-type thermoelectric conversion material and constantan metal powder as an n-type thermoelectric conversion material were prepared, followed by adding predetermined amounts of varnish and a solvent to each of the powders and kneading in a three roll mill, thereby manufacturing a copper paste and a constantan paste.

Figure 4A:
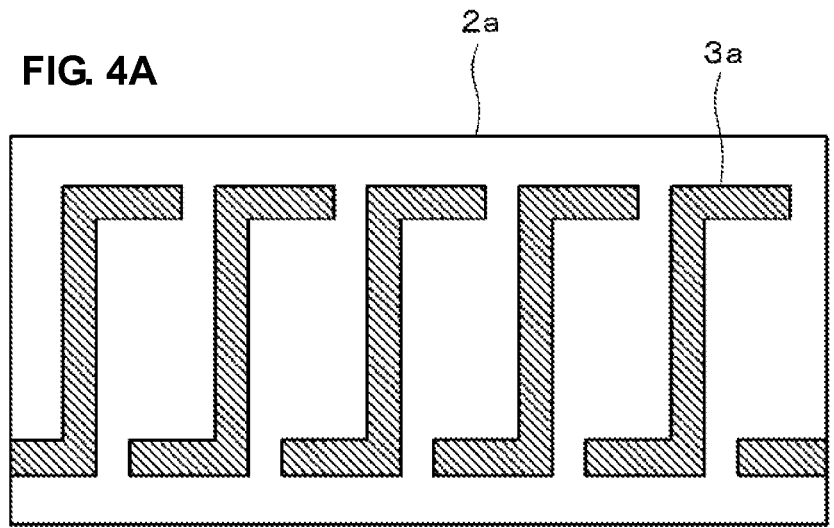
FIGS. 4A and 4B are a plan view and a cross-sectional view each illustrating a state in which a p-type thermoelectric conversion material is printed on an insulator green sheet in a step of a method for manufacturing a thermoelectric conversion module according to a preferred embodiment of the present invention.
Figure 4B:
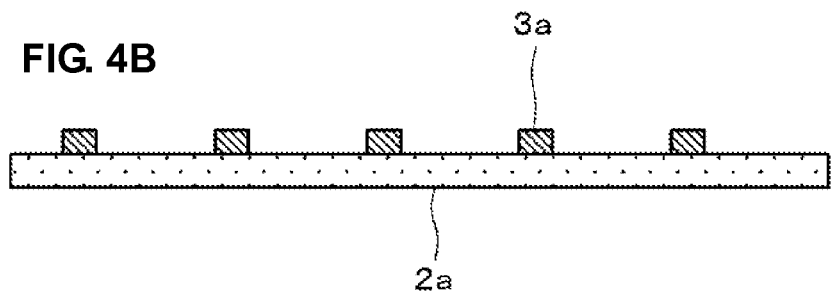

The copper paste and constantan paste were printed and calcined to form a p-type thermoelectric conversion material layer and an n-type thermoelectric conversion material layer.
Formation of Thermoelectric Conversion Material Patterns onto Insulator Green Sheet (1) First, the insulator green sheet was punched into a predetermined size, and a p-type thermoelectric conversion material (copper paste) 3a was applied on an insulator green sheet 2a, as shown in FIGS. 4A and 4B.

Figure 5A:
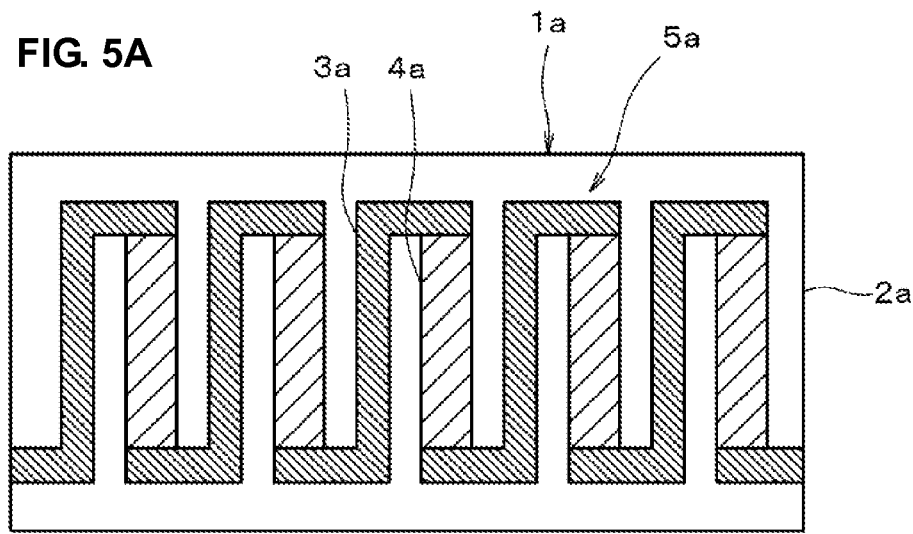
FIGS. 5A and 5B are a plan view and a cross-sectional view each illustrating a state in which an n-type thermoelectric conversion material is printed on the insulator green sheet to form a thermoelectric conversion element section in a step of the method for manufacturing a thermoelectric conversion module according to a preferred embodiment of the present invention.
Figure 5B:
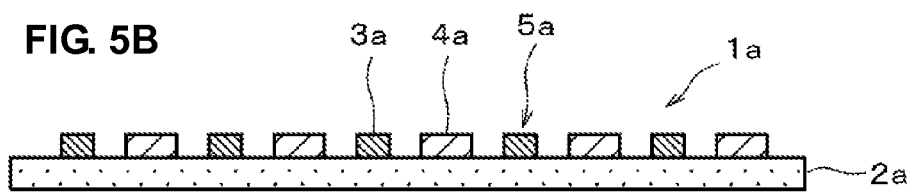

(2) Next, as shown in FIGS. 5A and 5B, an n-type thermoelectric conversion material (constantan paste) 4a was screen-printed in such a way that 25 pairs of p-n junctions are arranged in series to form a serpentine-shaped thermoelectric conversion element section 5a.

It is to be noted that the printed thicknesses of the copper paste and the constantan paste as the thermoelectric conversion materials each have three levels of thicknesses, about 20 μm, about 40 μm, and about 60 μm, and predetermined thicknesses were obtained by a method such as repeated printing a plurality of times.

Figure 6A:
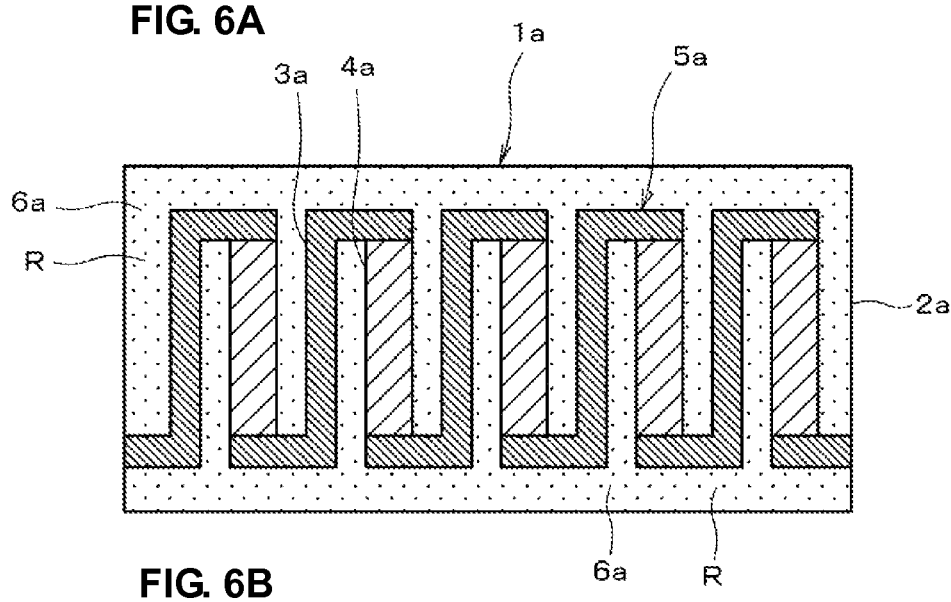
FIGS. 6A and 6B are a plan view and a cross-sectional view each illustrating a thermoelectric component formed by printing an insulating material (insulator paste) for step eliminating on a region of the insulator green sheet in which none of the n-type and p-type thermoelectric conversion materials is printed, in a step of the method for manufacturing a thermoelectric conversion module according to a preferred embodiment of the present invention.
Figure 6B:
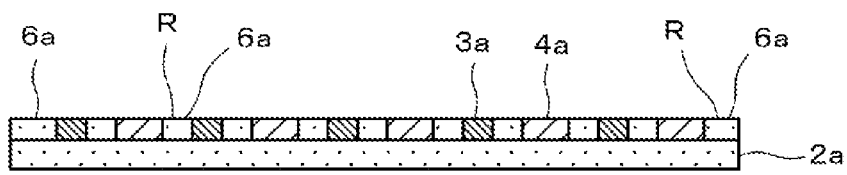
Figure 7:
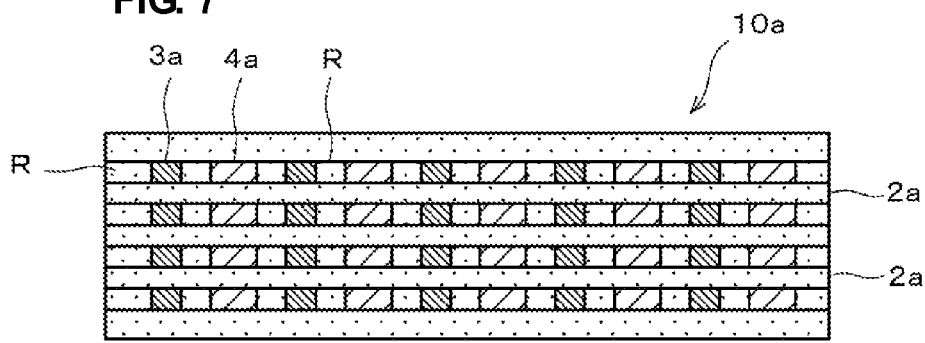
FIG. 7 is a diagram illustrating an uncalcined laminated body formed by laminating the thermoelectric components shown in FIGS. 6A and 6B.
Figure 10:
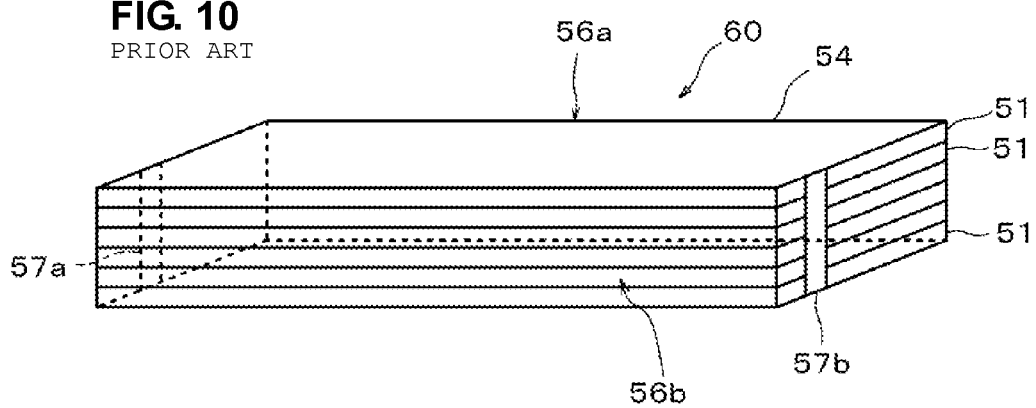
FIG. 10 is a perspective view illustrating the conventional thermoelectric conversion module.

(3) Next, as shown in FIGS. 6A and 6B, an insulating material (insulator paste) 6a for step eliminating, prepared as described above, was screen-printed on a region R of the insulator green sheet 2a in which none of the copper paste 3a and the constantan paste 4a was not applied, so as to eliminate steps caused by the application of the copper paste 3a and the constantan paste 4a, thereby forming an uncalcined thermoelectric component 1a.
Manufacture and Calcination of Laminated Body, and Formation of External Electrode (1) Then, a predetermined number (20 sheets in this example) of the obtained thermoelectric components 1a were laminated and pressure-bonded to manufacture an uncalcined laminated body 10a (FIG. 7).

(2) Then, this laminated body 10a was calcined in a reducing atmosphere at about 980° C. for about 0.5 hours.

(3) Then, a conductive paste containing silver powder as a conductive component was applied on the opposite end faces 11a, 11b of the calcined laminated body 10, and baked to form external electrodes 7a, 7b for output power extraction, thereby obtaining a thermoelectric conversion module 20 as shown in FIGS. 1 to 3.

It is to be noted that by way of comparison, a thermoelectric conversion module of a comparative example was manufactured in the same way as in the example described above, except that an insulating material (insulator paste) for step eliminating was not printed so as to eliminate steps caused by the application of the copper paste and the constantan paste.
Evaluation The thermoelectric conversion modules manufactured as described above were used as samples to evaluate the states of deviation of the lamination and the magnitudes of the output per unit area.
Evaluation Method of Deviation of Lamination The surface parallel to the direction in which the temperature difference was caused was polished, and the states of deviation of the lamination of the internal thermoelectric conversion materials were observed through a microscope.
Evaluation Method of Output One side (high temperature section) of each sample (thermoelectric conversion module) manufactured was heated with a heater as a heat source, whereas the other side (low temperature section) thereof was cooled with a water-cooled chiller, to form the high temperature section and the low temperature section, thereby providing a temperature difference to the thermoelectric conversion module. In the state, the external electrodes 7a, 7b (FIG. 1) of the thermoelectric conversion module were irradiated with a probe to measure the maximum output ($W_{max}$).

The evaluation results obtained as described above are shown in Table 1.

TABLE 1

| Sample Number | Thickness of Insulator Green Sheet (um) | Printed Thickness of Thermoelectric Conversion Material (um) | Application of Insulating Material Paste for Step eliminating | Condition of Lamination | Maximum Output ($W_{max}$) |
|---|---|---|---|---|---|
| 1* | 25 | 20 | No | ○ | 10.7 mW/cm² |
| 2* | 25 | 40 | No | X | — |
| 3* | 25 | 60 | No | X | — |
| 4 | 25 | 20 | Yes | ○ | 10.8 mW/cm² |
| 5 | 25 | 40 | Yes | ○ | 16.7 mW/cm² |
| 6 | 25 | 60 | Yes | ○ | 28.4 mW/cm² |

It is to be noted that in Table 1, the state of the lamination was evaluated as defective (x) when deviation of the lamination is caused to damage the characteristics, or as favorable (○) when such deviation of the lamination is not caused.

As shown in Table 1, in the cases of sample numbers 1 to 3 of the comparative examples with no insulating material for step eliminating (insulator paste) printed, when the p-type and n-type thermoelectric conversion materials have a printed thickness of about 20 μm and thinner than the thickness (about 25 μm) of the insulator green sheet (sample number 1), the occurrence of deviation of the lamination was not observed. However, when the p-type and n-type thermoelectric conversion materials have a printed thickness of about 40 μm or about 60 μm and thicker than the thickness (about 25 μm) of the insulator green sheet (sample number 2 or 3), deviation of the lamination occurred, resulting in the inability to evaluate the output.

In contrast, in the cases of the samples of sample numbers 4 to 6 according to the example of a preferred embodiment of the present invention with the insulating material for step eliminating (insulator paste) printed, no deviation of the lamination occurred in either case, and it was confirmed that the output of about 16.7 mW/cm² was obtained in the case of the sample 5 with the p-type and n-type thermoelectric conversion materials having a printed thickness of about 40 µm, whereas the output of about 28.4 mW/cm² was obtained in the case of the sample 6 with the p-type and n-type thermoelectric conversion materials having a printed thickness of about 60 µm.

It is to be noted that the occurrence of deviation of the lamination was not observed in either case of the sample of sample number 1 with no insulating material for step eliminating printed or the sample of sample number 4 with the insulating material for step eliminating printed when the p-type and n-type thermoelectric conversion materials have a printed thickness of about 20 µm and thinner than the thickness of the insulator green sheet. However, since the thermoelectric conversion materials have the thinner printed thickness of about 20 µm, the obtained output was smaller.

Therefore, if a sufficient output is to be obtained, it is necessary to increase the printed thickness of the thermoelectric conversion materials. In such a case, deviation of the lamination will be caused in the conventional configurations (sample numbers 2 and 3) with no insulating material for step eliminating printed, thereby resulting in the inability to obtain a thermoelectric conversion module which is able to provide desirable outputs, while in the case of the samples (sample numbers 5 and 6) according to the example of a preferred embodiment of the present invention with the step elimination insulating material printed, no deviation of the lamination will be caused even when the thermoelectric conversion material is increased in printed thickness, thereby realizing a thermoelectric conversion module which provides higher outputs in a meaningful manner.

It is to be noted that, while in the example described above, the case of the serpentine-shaped thermoelectric conversion element section including the p-type and n-type thermoelectric conversion material layers connected in series has been described as an example, the thermoelectric conversion element section can also have other shapes.

Furthermore, while in the example described above, the case has been described as an example, in which the insulating material constituting the insulating material layer for eliminating steps preferably has the same composition as that of the insulating material constituting the insulating layer, an insulating material differing from the insulating material constituting the insulating layer can alternatively be used as the insulating material constituting the step eliminating insulating material layer.

Further, the present invention is not to be considered limited to the examples and preferred embodiments described above, also in terms of the other aspects, and various applications and modifications can be made without departing from the scope of the present invention, as for the specific conditions such as the types of the p-type and n-type thermoelectric conversion materials, the number of laminated thermoelectric components, and calcination conditions.

As described above, according to various preferred embodiments of the present invention, it is possible to obtain a smaller thermoelectric conversion module which provides higher outputs and electromotive forces without causing deviation of lamination or deformation even when the p-type thermoelectric conversion material layers and the n-type thermoelectric conversion material layers are increased in thickness in order to increase the occupancy of the thermoelectric conversion materials.

Therefore, preferred embodiments of the present invention can be effectively used as a thermoelectric conversion device for electric power generation which converts heat directly to electricity in a variety of fields in which waste heat is generated.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a thermoelectric conversion module, the method comprising the steps of:
   arranging p-type thermoelectric conversion material patterns and n-type thermoelectric conversion material patterns in a series connection on a principal surface of an insulating green sheet to form a thermoelectric conversion element section pattern to serve as a thermoelectric conversion element section after calcination;
   providing a step eliminating insulating material on a region of the principal surface of the insulator green sheet in which none of the p-type thermoelectric conversion material and n-type thermoelectric conversion material is formed, in such a way that steps between surfaces of the p-type thermoelectric conversion material patterns and the n-type thermoelectric conversion material patterns and the principal surface of the insulator green sheet are substantially eliminated, thereby forming thermoelectric component sheets;
   laminating and pressure-bonding the thermoelectric component sheets to form a laminated body; and
   calcining the laminated body; wherein
   all of the p-type thermoelectric conversion material patterns, all of the n-type thermoelectric conversion material patterns, and all of the step eliminating insulating material are disposed directly on the principal surface of the insulating green sheet; and
   as the step eliminating insulating material layer, a material is used which has a same composition as or a similar composition to that of an insulating material constituting the insulating green sheet.

2. The method for manufacturing a thermoelectric conversion module according to claim 1, wherein the plurality of p-type thermoelectric conversion material patterns and the plurality of n-type thermoelectric conversion material layers are alternately arranged in an electrically series connection to form a serpentine-shaped thermoelectric conversion element section pattern.

3. The method for manufacturing a thermoelectric conversion module according to claim 1, wherein thicknesses of the p-type thermoelectric conversion material patterns and the n-type thermoelectric conversion material patterns are greater than a thickness of the insulator green sheet.

* * * * *